United States Patent
Lee et al.

(10) Patent No.: US 9,847,469 B2
(45) Date of Patent: Dec. 19, 2017

(54) NATURAL-SUPERLATTICE-STRUCTURED THERMOELECTRIC MATERIAL

(71) Applicants: SK INNOVATION CO., LTD., Seoul (KR); UNIVERSITY-INDUSTRY COOPERATION GROUP OF KYUNG HEE UNIVERSITY, Gyeonggi-do (KR)

(72) Inventors: Hyeung Jin Lee, Daejeon (KR); Yong Rae Cho, Daejeon (KR); Jong-Soo Rhyee, Gyeonggi-do (KR); Yoo Jang Song, Gyeonggi-do (KR); Jin Hee Kim, Gyeonggi-do (KR)

(73) Assignees: SK INNOVATION CO., LTD., Seoul (KR); UNIVERSITY-INDUSTRY COOPERATION GROUP OF KYUNG HEE UNIVERSITY, Gyeonggi-do (KR)

( * ) Notice: Subject to any disclaimer, the term of this patent is extended or adjusted under 35 U.S.C. 154(b) by 265 days.

(21) Appl. No.: 14/779,784

(22) PCT Filed: Mar. 25, 2014

(86) PCT No.: PCT/KR2014/002490
§ 371 (c)(1),
(2) Date: Dec. 2, 2015

(87) PCT Pub. No.: WO2014/157909
PCT Pub. Date: Oct. 2, 2014

(65) Prior Publication Data
US 2016/0099396 A1    Apr. 7, 2016

(30) Foreign Application Priority Data

Mar. 25, 2013 (KR) .................. 10-2013-0031534

(51) Int. Cl.
*H01L 35/12* (2006.01)
*H01L 35/16* (2006.01)
(Continued)

(52) U.S. Cl.
CPC ............ *H01L 35/16* (2013.01); *C01B 19/007* (2013.01); *H01L 35/04* (2013.01); *H01L 35/28* (2013.01)

(58) Field of Classification Search
CPC ............................. H01L 35/16; C01B 19/007
See application file for complete search history.

(56) References Cited

U.S. PATENT DOCUMENTS

| 5,994,639 A | 11/1999 | Johnson et al. |
| 2006/0097241 A1* | 5/2006 | Harris ..................... C30B 29/68 257/9 |
| 2010/0233454 A1* | 9/2010 | Johnson .................. C23C 14/14 428/216 |

FOREIGN PATENT DOCUMENTS

| KR | 1020110104180 | 9/2011 |
| KR | 1020120019701 | 3/2012 |

(Continued)

*Primary Examiner* — Carol M Koslow
(74) *Attorney, Agent, or Firm* — IP&T Group LLP (57) ABSTRACT

Provided is a thermoelectric material satisfying $(MX)_{1+a}(TX_2)_n$ and having a superlattice structure, wherein M is at least one element selected from the group consisting of Group 13, Group 14, and Group 15, T is at least one element selected from Group 5, X is a chalcogenide element, a is a real number satisfying $0<a<1$, and n is a natural number of 1 to 3.

11 Claims, 5 Drawing Sheets

(51) Int. Cl.
*C01B 19/00* (2006.01)
*H01L 35/04* (2006.01)
*H01L 35/28* (2006.01)

(56) References Cited

FOREIGN PATENT DOCUMENTS

KR 1020120050905 5/2012
WO WO 2007/047928 * 4/2007

* cited by examiner

NATURAL-SUPERLATTICE-STRUCTURED THERMOELECTRIC MATERIAL

This application is a national stage application of PCT/KR2014/002490 filed on Mar. 25, 2014, which claims priority of Korean patent application number 10-2013-0031534 filed on Mar. 25, 2013. The disclosure of each of the foregoing applications is incorporated herein by reference in its entirety.

TECHNICAL FIELD

The present invention relates to a natural-superlattice-structured thermoelectric material, and more specifically, to a thermoelectric material having a natural superlattice structure of a chalcogenide compound.

BACKGROUND ART

In general, a thermoelectric material is a material which is applicable to active cooling and cogeneration by using a Peltier effect and a Seebeck effect. The Peltier effect is a phenomenon that when a DC voltage is applied from the outside, holes of a p-type material and electrons of an n-type material are moved to induce heat generation and heat absorption at both ends of the materials. The Seebeck effect is a phenomenon that when heat is supplied from external heat source, electrons and holes are moved to create a current flow in materials, thereby inducing electricity generation The active cooling using the thermoelectric material neither generates vibration and noise nor uses a separate condenser and refrigerant while improving thermal stability of an element and having a small volume, and accordingly, it is recognized as an environment-friendly method. The active cooling using the thermoelectric material is usable for a free refrigerant refrigerator, air conditioner, various micro-cooling systems, and the like. In particular, when attaching a thermal element to various memory elements, since it is possible to reduce volume and maintain the element at a uniform and stable temperature, performance of the element may be improved as compared to the existing cooling systems.

Meanwhile, when the thermoelectric material is utilized for thermoelectric power generation using the Seebeck effect, since waste heat is possible to be utilized as an energy source, such that it is applicable to various fields for increasing efficiency of energy such as power of automobile engines, exhaust systems, waste incinerators, steel mill waste heat, and medical devices in a human body using body heat or collecting waste heat.

As a factor for measuring performance of the thermoelectric material, a dimensionless thermoelectric figure of merit (ZT) value is used. In order to increase the ZT value, a material having a high Seebeck coefficient, high electric conductivity, and low thermal conductivity is required.

It is known that when a low-dimensional nanostructure is produced by a method for implementing high ZT value, a Seebeck coefficient is increased by a quantum confinement effect, and when energy barrier is made in a metal or thermoelectric semiconductor at a thickness shorter than a mean free path of electrons and longer than a mean free path of phonon, electricity passes, and heat is blocked, such that the ZT value is increased.

It was experimentally found that at the time of creating a superlattice having a PbSeTe layer on PbTe, and a superlattice having $Bi_2Te_3$ layers and $Sb_2Te_3$ layers stacked on each other in order to actually realize a phonon glass-electron crystal (PGEC) passing electrons and blocking heat, the ZT values are significantly and largely improved (Nature vol. 413, p. 597, 2001). However, since this superlattice creation needs to artificially use a thin film process, expensive facilities are required, and even though the thin film is sufficiently thickened, a thickness of the thin film is merely hundreds of nm, such that it is not actually usable for thermoelectric power generation and cooling devices.

DISCLOSURE

Technical Problem

An object of the present invention is to provide a high efficient thermoelectric material naturally forming a superlattice structure, having low thermal conductivity, easily produced in bulk, being mass-produced at a low price, and being commercially utilized.

Technical Solution

In one general aspect, there is provided a thermoelectric material satisfying Chemical Formula 1 below and having a superlattice structure:

$$(MX)_{1+a}(TX_2)_n \qquad \text{Chemical Formula 1}$$

in Chemical Formula 1 above, M is at least one element selected from the group consisting of Group 13, Group 14, and Group 15, T is at least one element selected from transition metals, X is a chalcogenide element, a is a real number satisfying $0<a<1$, and n is a natural number of 1 to 3.

The a in Chemical Formula 1 above may be a real number satisfying $0.0 \le a \le 0.23$.

The superlattice structure may be formed by alternately stacking $(MX)_{1+a}$ layers and $TX_2$ layers (the number of $TX_2$ layers is n).

The superlattice structure may be naturally formed by applying energy to a mixture containing M, X, and T each weighted so as to satisfy Chemical Formula 1 above.

In Chemical Formula 1 above, X may be at least one selected from the group consisting of S, Se and Te.

In Chemical Formula 1 above, M may be at least one selected from the group consisting of Bi, Pb, Sn and Sb.

In Chemical Formula 1 above, T may be at least one element selected from Group 5.

In Chemical Formula 1 above, T may be at least one selected from the group consisting of V, Ta, and Nb.

The thermoelectric material may be in a bulk form.

A ratio of a thermoelectric figure of merit (ZT) in an axial direction (cross-plane direction) to a thermoelectric figure of merit (ZT) in a plane direction (in-plane direction) at 570K may be 0.25 or more.

The thermoelectric material may further include doping impurities.

Advantageous Effects

The thermoelectric material according to the present invention may naturally have a superlattice structure, to be mass-produced and commercialized, remarkably reduce production cost, and achieve production of a bulk typed thermoelectric material, and be produced in various shapes and scales in consideration of the usages. The thermoelectric material is effectively usable for free refrigerant refrigerators, air conditioners, cogeneration, thermoelectric nuclear power for military aerospace, micro-cooling systems, and the like.

BEST MODE

Hereinafter, a thermoelectric material according to the present invention will be described in detail with reference to the accompanying drawings. The exemplary embodiments of the present invention to be described below are provided by way of example so that the idea of the present invention can be sufficiently transferred to those skilled in the art to which the present invention pertains. Therefore, the present invention may be implemented in many different forms, without being limited to the drawings to be described below. The drawings may be exaggerated in order to specify the spirit of the present invention. Like reference numerals denote like elements throughout the specification.

Meanwhile, unless technical and scientific terms used herein are defined otherwise, they have general meanings understood by those skilled in the art to which the present invention pertains. Known functions and components will be omitted so as not to obscure the gist of the present invention with unnecessary detail.

A thermoelectric material according to the present invention satisfies Chemical Formula 1 below and has a superlattice structure:

$(MX)_{1+a}(TX_2)_n$      (Chemical Formula 1)

in Chemical Formula 1 above, M is at least one element selected from the group consisting of Group 13, Group 14, and Group 15, T is at least one element selected from transition metals, X is a chalcogenide element, a is a real number satisfying 0<a<1, and n is a natural number of 1 to 3.

The thermoelectric material according to an exemplary embodiment of the present invention may have a layered structure including a layer (plane) in which at least one element selected from the group consisting of Group 13, Group 14, and Group 15 is combined with a chalcogenide element, and a layer in which at least one element selected from transition metals is combined with a chalcogenide element, and these layers may be alternately stacked. Accordingly, the thermoelectric material in an in-plane direction has a covalent bond, and the thermoelectric material in a cross-plane direction has an ionic bond and/or Van der Waals bond, such that the thermoelectric material may have a high Seebeck coefficient and low thermal conductivity.

Specifically, the covalent bond in an in-plane direction restricts movement of electrons in the in-plane direction, to form a low dimensional electromagnetic field.

Generally, it is known that when a material has a low dimensional conductive property, energy density of state becomes increased at Fermi level, and when the energy density of state has a sharp singular point, the Seebeck coefficient is increased as shown in Equation 1 below:

$$S \propto \left. \frac{d^2 \ln(\varepsilon)}{dk^2} \right|_{\varepsilon = \varepsilon_f} \quad \text{[Equation 1]}$$

in Equation 1, S is a Seebeck coefficient, $\varepsilon$ is energy, $\varepsilon_f$ is Fermi energy, and k is crystal momentum.

The thermoelectric material according to an exemplary embodiment of the present invention has a low dimensional electrical property in a lattice structure thereof to have increased energy density of state at Fermi energy level, and to have a high Seebeck coefficient due to the increased energy density of state. That is, the thermoelectric material according to Chemical Formula 1 may have a low thermal conductivity and a high Seebeck coefficient due to a low dimensional conductive property of electrons.

Specifically, the thermoelectric material according to an exemplary embodiment of the present invention may have an electrical conductivity (S/m) in an in-plane direction improved over three times, on the basis of an electrical conductivity (S/m) in an in-plane direction of a reference material at 300K temperature, wherein the reference material is $TX_2$ (T is at least one element selected from transition metals, X is a chalcogenide element, and T and X in Chemical Formula 1 are the same as each other).

Specifically, the thermoelectric material according to an exemplary embodiment of the present invention may have thermal conductivity of 5 W/mK or less at room temperature.

Specifically, the thermoelectric material according to an exemplary embodiment of the present invention may have thermal conductivity corresponding to 0.35 times or less of thermal conductivity (15 W/mK) of a reference material at 300K temperature, wherein the reference material is $TX_2$ (T is at least one element selected from transition metals, X is a chalcogenide element, and T and X in Chemical Formula 1 are the same as each other). Here, thermal conductivity may be thermal conductivity in an in-plane direction and/or thermal conductivity in a cross-plane direction.

Specifically, in the thermoelectric material according to an exemplary embodiment of the present invention, a ratio of a thermoelectric figure of merit (ZT) in an axial direction (cross-plane direction) to a thermoelectric figure of merit (ZT) in a plane direction (in-plane direction) at 570K may be 0.25 or more.

The thermoelectric material according to an exemplary embodiment of the present invention may have a superlattice structure, and the superlattice structure may be formed by alternately stacking $(MX)_{1+a}$ layers and $TX_2$ layers (the number of $TX_2$ layers is n). Here, the stacked direction may be a cross-plane direction, and a direction in $(MX)_{1+a}$ layer and/or $TX_2$ layer may be an in-plane direction.

Specifically, the thermoelectric material according to an exemplary embodiment of the present invention may have a superlattice structure in which $(MX)_{1+a}$ layers and $TX_2$ layers are alternately stacked, for example, a superlattice structure in which one $(MX)_{1+a}$ layer and two $TX_2$ layers are alternately stacked, or a superlattice structure in which one $(MX)_{1+a}$ layer and three $TX_2$ layers are alternately stacked.

Here, as described above, the $(MX)_{1+a}$ layer and the $TX_2$ layer may be combined with each other by Van der Waals bond or an ionic bond.

The thermoelectric material according to an exemplary embodiment of the present invention may have a superlattice structure, and the superlattice structure may be a natural superlattice structure. That is, the natural superlattice structure may be formed by naturally stacking respective layers ($(MX)_{1+a}$ layer and $TX_2$ layer), rather than an artificial superlattice structure in which respective layers ($(MX)_{1+a}$ layer and $TX_2$ layer) configuring the superlattice structure are artificially stacked.

Unlike the artificial superlattice structure, the natural superlattice structure neither requires a high vacuum precision deposition equipment for manufacture, nor requires strict process control. In particular, mass production and commercialization of the thermoelectric material may be achieved, production cost may be remarkably reduced, production of a bulk typed thermoelectric material may be achieved, and the thermoelectric material having the natural superlattice structure may be produced in various shapes and scales in consideration of the usages.

Specifically, in the thermoelectric material according to an exemplary embodiment of the present invention, the superlattice structure may be a natural superlattice structure which is naturally formed by applying energy to a mixture containing M, X, and T each weighted so as to satisfy Chemical Formula 1 above.

Here, as non-limiting examples, M, X and T contained in the mixture in which energy is applied may indicate pure raw material elements, respectively, and the mixture may include a powdered type.

In addition, as non-limiting examples, the energy to be applied may be at least one energy selected from heat energy, light energy, vibration energy, ion beam energy, electron beam energy, and radiation energy.

As described above, the thermoelectric material according to an exemplary embodiment of the present invention may satisfy Chemical Formula 1 below and have a natural superlattice structure:

(Chemical Formula 1)

$(MX)_{1+a}(TX_2)_n$ in Chemical Formula 1 above, M is at least one element selected from the group consisting of Group 13, Group 14, and Group 15, T is at least one element selected from transition metals, X is a chalcogenide element, a is a real number satisfying $0<a<1$, and n is a natural number of 1 to 3.

In the thermoelectric material according to an exemplary embodiment of the present invention, a in Chemical Formula 1 above may be specifically a real number satisfying $0<a\leq0.5$, more specifically, $0.07\leq a\leq0.23$.

In the thermoelectric material according to an exemplary embodiment of the present invention, X in Chemical Formula 1 above may be at least one chalcogenide element selected from the group consisting of S, Se and Te. That is, X in Chemical Formula 1 above may be a single kind of a chalcogenide element or two or more different kinds of chalcogenide elements. In addition, in Chemical Formula 1 above, the chalcogenide element combined with M and the chalcogenide element combined with T may be the same as each other or different from each other.

In the thermoelectric material according to an exemplary embodiment of the present invention, M in Chemical Formula 1 may be at least one element selected from the group consisting of Pb, Bi, Sn, Sb, B, Si, Ge and As, and more specifically, may be at least one element selected from the group consisting of Bi, Pb, Sn and Sb.

In the thermoelectric material according to an exemplary embodiment of the present invention, T in Chemical Formula 1 above may be at least one element selected from transition metals, specifically, may be at least one element selected from Group 5. Here, Group 5 includes V, Ta and Nb. That is, specifically, T in Chemical Formula 1 above may be at least one element selected from the group consisting of V, Ta, and Nb.

Specifically, in the thermoelectric material according to an exemplary embodiment of the present invention, MX in Chemical Formula 1 above may be BiSe, PbTe, BiTe, SnSe, SnS, SnTe, or the like, and $TX_2$ in Chemical Formula 1 above may be $TaSe_2$, $NbSe_2$, $TaS_2$, or the like.

More specifically, in the thermoelectric material according to an exemplary embodiment of the present invention, MX and $TX_2$ in Chemical Formula 1 above may be BiSe and $TaSe_2$, SnSe and $TaSe_2$, BiSe and $NbTe_2$, and the like.

As described above, the thermoelectric material according to an exemplary embodiment of the present invention may have a natural superlattice structure. Accordingly, the thermoelectric material satisfying Chemical Formula 1 above and having a superlattice structure may be manufactured only by mixing raw materials each weighted so as to satisfy Chemical Formula 1 and applying energy to the mixture.

Accordingly, the thermoelectric material according to an exemplary embodiment of the present invention may be in a bulk form, and may be a predetermined shaped bulk that is suitable for various uses. Specifically, the thermoelectric material may be a bulk form having various shapes that are suitable for various uses, such as a rectangular parallelepiped shape, a cube shape, a cylindrical shape, a multiple rod shape, and the like. In addition, the thermoelectric material according to an exemplary embodiment of the present invention may have a more complex shape depending on the usages by pulverization and compression-molding. In addition, the thermoelectric material according to an exemplary embodiment of the present invention may be a powdered type, and the powdered type may be obtained by pulverizing the thermoelectric material obtained by applying energy.

In addition, the thermoelectric material according to an exemplary embodiment of the present invention may be manufactured into a thin film shape by general methods including pulverization of a thermoelectric material, application of a solution including the powderized thermoelectric material, heat-treatment of the applied film, and the like, and may have one-dimensional nanostructure including one-dimensional nanowire and/or nanotube by using templates such as a porous template, and the like.

The thermoelectric material according to an exemplary embodiment of the present invention may be a polycrystal or a monocrystal, and specifically, may be a polycrystal bulk, a thin film of the polycrystal, one-dimensional nanostructure of the polycrystal, a monocrystal bulk, a thin film of the monocrystal, or one-dimensional nanostructure of the monocrystal.

The thermoelectric material according to an exemplary embodiment of the present invention may satisfy Chemical Formula 1 above and have the natural superlattice structure by applying energy to raw materials, to thereby have significantly high density. Specifically, the thermoelectric material according to an exemplary embodiment of the present invention may have density of 70 to 100%, specifically, 95 to 100%, based on a theoretical density according to Chemical Formula 1. Due to high density, the thermoelectric material according to an exemplary embodiment of the present invention may have more excellent ion conductivity, and may maintain more stable thermal and electrical properties.

The thermoelectric material according to an exemplary embodiment of the present invention may further include doping elements (doping impurities) which are a trance amount of impurities. The doping elements prevent 2 band conduction co-existing electrons and holes to mainly induce conduction of the electrons or conduction of the holes, thereby improving a power factor, and more deteriorating thermal conductivity. As a specific example, the doping element at M position may be at least one element selected from Pb, Ti, and Sn, and the doping element at T position may be at least one transition metal.

The thermoelectric material according to an exemplary embodiment of the present invention may be a p-type thermoelectric element or n-type thermoelectric element.

Hereinafter, a method for manufacturing the thermoelectric material according to an exemplary embodiment of the present invention is described. However, as described above, the thermoelectric material according to the present invention satisfying Chemical Formula 1 and naturally having a superlattice structure may be manufactured only by applying energy to a mixture containing element materials each weighted so as to satisfy Chemical Formula 1, such that the thermoelectric material according to the present invention is possible to be manufactured by all generally known methods for preparing a crystalline chalcogenide compound by applying energy to raw materials.

As a specific and non-limiting example, the thermoelectric material according to the present invention may be manufactured by a method of using ampoule, a solid state reaction, an arc melting method, a vapor transport method, a Czochralski method, a Bridgeman method, and the like.

Specifically, the method of using ampoule is a method of injecting raw material elements into a quartz tube or an ampoule made of a metal, followed by vacuum sealing and heat treatment.

Specifically, the solid state reaction is a method of mixing raw material powders, and performing compression-molding to manufacture a molded body, and then heat-treating the molded body or heat-treating the mixture of the raw material powders. Here, the solid state reaction may include spark plasma sintering or hot press sintering, and may include directional sintering. The directional sintering may include high temperature compression sintering or extrusion sintering, and may further include annealing for reducing residual stress by pressure to be applied with directivity.

Specifically, the arc melting method is a method of injecting raw material elements into a reaction chamber, inducing arc discharge in an inert gas atmosphere to melt the raw material elements, and performing a cooling process.

Specifically, a vapor transport method is a method of injecting raw material elements into one region of furnace for heat treatment, applying heat to vaporize the raw material elements, transporting the vaporized raw material elements to a lower region using a carrier gas, and crystallizing and growing the vaporized raw material elements in the low temperature region.

Specifically, the Czochralski method is a method of using a thermoelectric material of a pre-prepared single crystal as a seed, contacting a crucible containing molten raw material elements and the seed, and slowly raising the seed to manufacture a thermoelectric material (ingot) of the single crystal.

Specifically, the Bridgeman method is a method of injecting raw material elements into a crucible, and partially controlling a temperature of the crucible so that a solid-liquid interface is sequentially moved from an end of the crucible to the opposite end thereof to manufacture a thermoelectric material of the single crystal.

Here, two or more methods among the above-described methods may be combined to be used. As a specific example, a thermoelectric ingot of a polycrystal is prepared by using an ampoule, followed by pulverization to be powdered, and molding the polycrystalline thermoelectric powder, and performing plasma sintering or hot press sintering, or extrusion-sintering the polycrystalline thermoelectric powder, to thereby manufacture a bulk thermoelectric material.

As described above, the thermoelectric material according to the present invention is possible to be manufactured by all generally known methods for preparing a crystalline chalcogenide compound by applying energy to raw materials. However, in view of preventing compositional change due to volatility of the chalcogenide element, it is preferable to use a manufacturing method in which a closed or a sealed condition is maintained, and as a specific and non-limiting example thereof, the thermoelectric material may be manufactured by using the ampoule.

Although the present invention has been specifically disclosed based on Examples, the Examples are provided by experimentally demonstrating the excellence of the present invention, and therefore, the present invention is not limited to the provided Examples.

Example

Bi, Se and Ta powders were weighted so as to satisfy compositions of $(BiSe)_{1+a}(TaSe_2)$ or $(BiSe)_{1+a}(TaSe_2)_2$ and put into a quartz tube, and the quartz tube was vacuum-sealed. Then, the vacuum-sealed quartz tube was heat-treated at 590° C. for 12 hours, a temperature thereof was raised to 800° C., and the quartz tube was heat-treated at 800° C. for 24 hours and rapidly cooled by water flowing to prepare an ingot of polycrystal thermoelectric material.

Then, the prepared ingot was powdered by agate mortar, and the prepared powder was put into a carbon mold, followed by spark plasma sintering at a temperature of 500° C. under a pressure of 70 MPa for 5 minutes to prepare a sintered body.

In order to measure Seebeck coefficient/electrical conductivity of the sintered body, the sintered body was processed into a size having a length of 7 to 10 mm and a width of 3×4 $mm^2$, and in order to measure thermal conductivity, the sintered body was processed into a disk having a thickness of 1 mm and a diameter of 10 mm.

As a comparison material, a $TaSe_2$ sintered body was prepared by the same method as Example except that Ta, and Se satisfying $TaSe_2$ were weighted and put into a quartz tube, and then processed in the same size.

Figure 1:
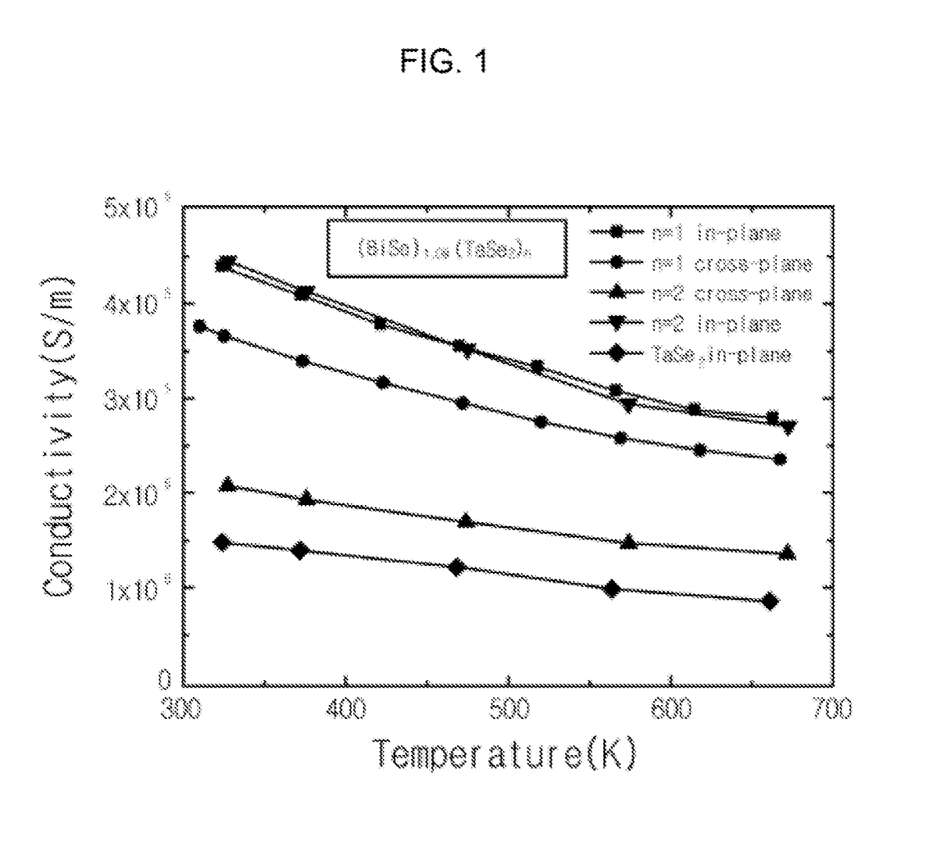
FIG. 1 shows electrical conductivities of $(BiSe)_{1.09}(TaSe_2)$, $(BiSe)_{1.09}(TaSe_2)_2$ and $TaSe_2$ measured depending on temperatures.

FIG. 1 shows electrical conductivities of $(BiSe)_{1+a}(TaSe_2)$, $(BiSe)_{1+a}(TaSe_2)$ and $TaSe_2$ measured depending on temperatures. As shown in FIG. 1, the thermoelectric material having a natural superlattice structure exhibited electrical conductivity improved over three times as compared to the $TaSe_2$. It could be appreciated that electrical conductivity in an in-plane direction of n=1 was similar to that of n=2, and electrical conductivity in a cross-plane direction of n=2 was further decreased as compared to n=1. It is considered from FIG. 1 that conduction of electrons is made mainly along an in-plane interface.

Figure 2:
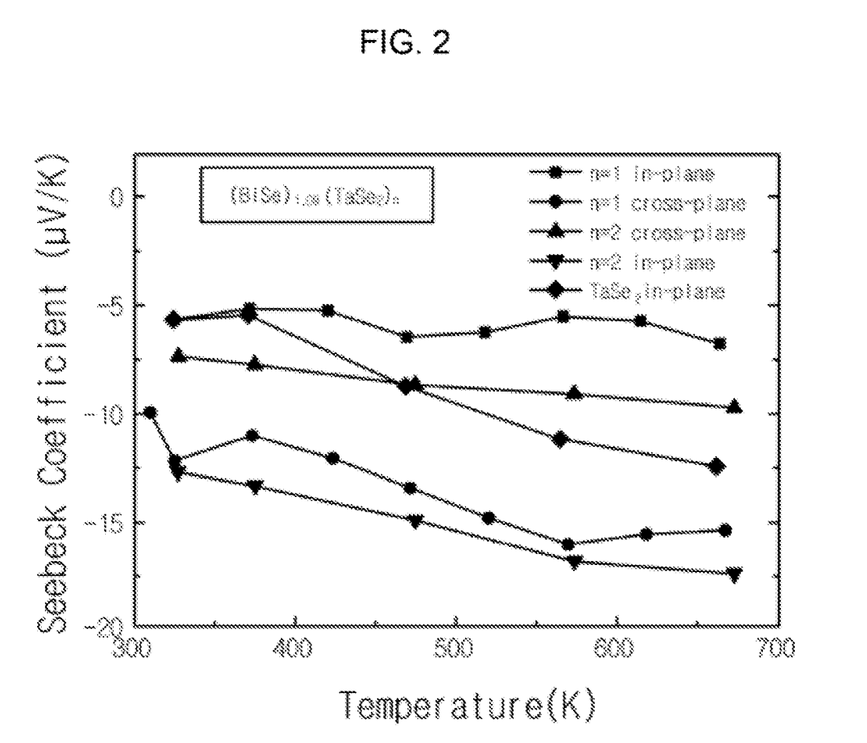
FIG. 2 shows Seebeck coefficients of $(BiSe)_{1.09}(TaSe_2)$, $(BiSe)_{1.09}(TaSe_2)_2$ and $TaSe_2$ measured depending on temperatures.

FIG. 2 shows Seebeck coefficients of $(BiSe)_{1+a}$ $(TaSe_2)$, $(BiSe)_{1+a}$ $(TaSe_2)_2$ and $TaSe_2$ measured depending on temperatures. As shown in FIG. 2, Seebeck coefficients were generally and significantly small, and in particular, Seebeck coefficients in an in-plane direction were significantly small, and Seebeck coefficients in a cross-plane direction were slightly improved. It is shown that a current, both of the electrons and the holes, flow at the same time along an in-plane interface.

Figure 3:
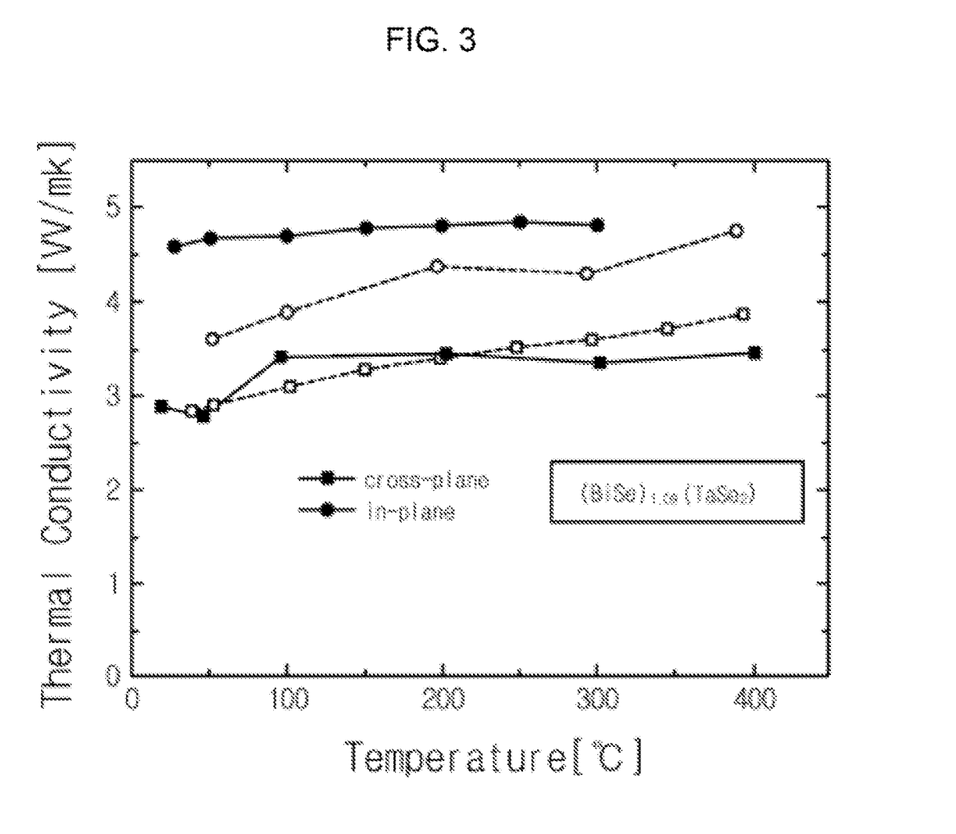
FIG. 3 shows thermal conductivities of $(BiSe)_{1.09}(TaSe_2)$, $(BiSe)_{1.09}(TaSe_2)_2$ and $TaSe_2$ measured depending on temperatures.

FIG. 3 shows thermal conductivities of $(BiSe)_{1+a}$ $(TaSe_2)$, $(BiSe)_{1+a}$ $(TaSe_2)_2$ and $TaSe_2$ measured depending on temperatures. As shown in FIG. 3, thermal conductivities of $(BiSe)_{1+a}$ $(TaSe_2)$, $(BiSe)_{1+a}$ $(TaSe_2)_2$ were significantly largely decreased than that of $TaSe_2$ (15 W/mK). It is shown that a principle in which thermal conductivity is decreased was properly operated in a misfit layer. In FIG. 3, an open symbol shows electronic thermal conductivity by Wiedemann-Franz (WF) law. Violation of the WF law in a cross-plane resulted from electron-hole mixing in an out-of-plane.

Figure 4:
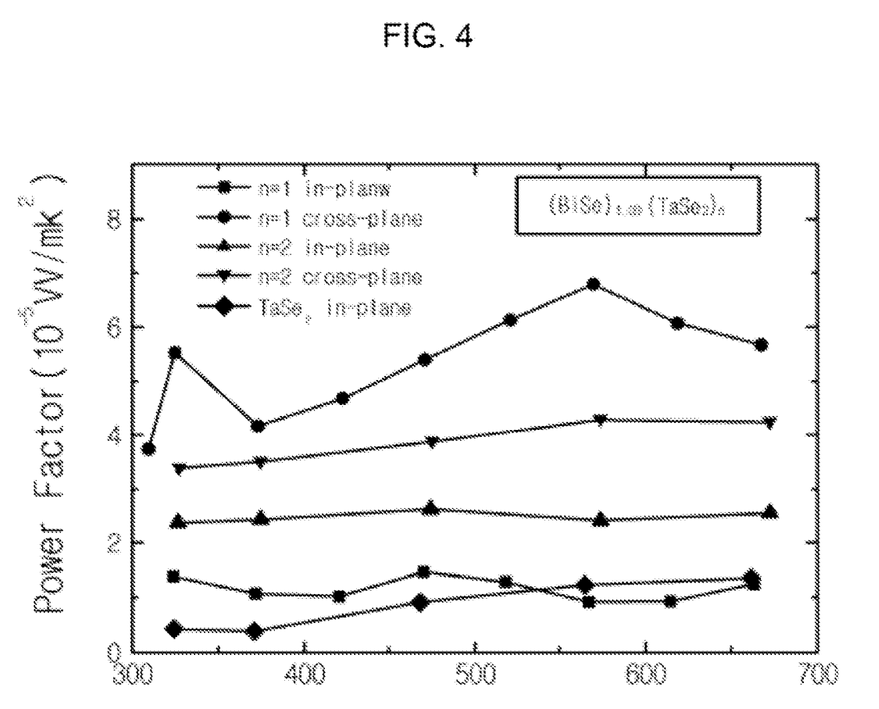
FIG. 4 shows power factors of $(BiSe)_{1.09}(TaSe_2)$, $(BiSe)_{1.09}(TaSe_2)_2$ and $TaSe_2$ measured depending on temperatures.
Figure 5:
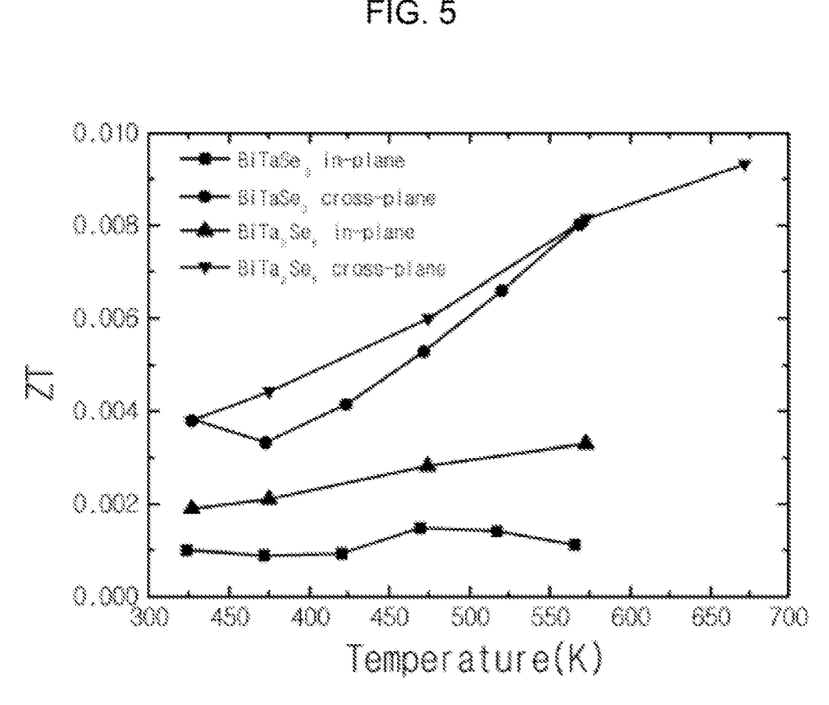
FIG. 5 shows thermoelectric figure of merit (ZT) values of $(BiSe)_{1.09}(TaSe_2)$ and $(BiSe)_{1.09}(TaSe_2)_2$ measured depending on temperatures.

FIG. 4 shows power factors of $(BiSe)_{1+a}$ $(TaSe_2)$, $(BiSe)_{1+a}$ $(TaSe_2)_2$ and $TaSe_2$ measured depending on temperatures, and it is shown from FIG. 5 that a bipolar characteristic of electron-hole is present in an in-plane interface.

FIG. 5 shows thermoelectric figure of merit (ZT) values of $(BiSe)_{1+a}$ $(TaSe_2)$ and $(BiSe)_{1+a}$ $(TaSe_2)_2$ measured depending on temperatures. As shown in FIG. 5, a ratio of a thermoelectric figure of merit (ZT) in an axial direction (cross-plane direction) to a thermoelectric figure of merit (ZT) in a plane direction (in-plane direction) at 570K is 0.25 or more.

Hereinabove, although the present invention is described by specific matters, limited exemplary embodiments, and drawings, they are provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described exemplary embodiments, and the following claims as well as all modified equally or equivalently to the claims are intended to fall within the scopes and spirit of the invention.

The invention claimed is:

1. A thermoelectric material satisfying Chemical Formula 1 below and having a superlattice structure:

$$(MX)_{1+a}(TX_2)_n \quad \text{Chemical Formula 1}$$

in Chemical Formula 1 above,

M is at least one element selected from the group consisting of Group 13, Group 14, and Group 15, T is at least one element selected from transition metals, X is a chalcogenide element, a is a real number satisfying $0 \leq a \leq 1$, and n is a natural number of 1 to 3.

2. The thermoelectric material of claim 1, wherein the a is a real number satisfying $0.07 \leq a \leq 0.23$.

3. The thermoelectric material of claim 1, wherein the superlattice structure is formed by alternately stacking $(MX)_{1+a}$ layers and $TX_2$ layers (the number of $TX_2$ layers is n).

4. The thermoelectric material of claim 1, wherein the superlattice structure is naturally formed by applying energy to a mixture containing M, X, and T each weighted so as to satisfy Chemical Formula 1 above.

5. The thermoelectric material of claim 1, wherein in Chemical Formula 1 above, X is at least one selected from the group consisting of S, Se and Te.

6. The thermoelectric material of claim 5, wherein in Chemical Formula 1 above, M is at least one selected from the group consisting of Bi, Pb, Sn and Sb.

7. The thermoelectric material of claim 6, wherein in Chemical Formula 1 above, T is at least one element selected from Group 5.

8. The thermoelectric material of claim 7, wherein in Chemical Formula 1 above, T is at least one selected from the group consisting of V, Ta, and Nb.

9. The thermoelectric material of claim 1, wherein the thermoelectric material is in a bulk form.

10. The thermoelectric material of claim 1, wherein a ratio of a thermoelectric figure of merit (ZT) in a cross-plane direction to a thermoelectric figure of merit (ZT) in an in-plane direction at 570K is 0.25 or more.

11. The thermoelectric material of claim 1, wherein the thermoelectric material further includes doping impurities.

* * * * *